United States Patent [19]

Tye et al.

[11] Patent Number: 4,745,613
[45] Date of Patent: May 17, 1988

[54] LASER FLASH LAMP TRIGGERING CIRCUIT

[75] Inventors: Gene E. Tye, Endicott; Joseph Montner, Binghamton, both of N.Y.

[73] Assignee: General Electric Co., Schenectady, N.Y.

[21] Appl. No.: 1,944

[22] Filed: Jan. 9, 1987

[51] Int. Cl.[4] .............................................. H01S 3/097
[52] U.S. Cl. ...................................... 372/81; 372/38; 372/85; 315/160; 315/241 P
[58] Field of Search .................... 315/160, 173, 241 P, 315/241 R, 246, 276, 218; 372/38, 69, 70, 85, 81

[56] References Cited

U.S. PATENT DOCUMENTS

| | | | |
|---|---|---|---|
| 3,708,758 | 1/1973 | Snow et al. | 372/38 |
| 4,447,766 | 5/1984 | Bedu et al. | 315/241 R |
| 4,469,991 | 9/1984 | McAllister | 315/246 |

Primary Examiner—James W. Davie
Assistant Examiner—B. Randolph
Attorney, Agent, or Firm—I. D. Blumenfeld

[57] ABSTRACT

A laser flash lamp triggering circuit is connected in parallel with the flash lamp and between the flash lamp and the flash lamp power supply. A impedance element is connected between the parallel trigger circuit network and the pulse forming network in the power supply. The impedance element preferably in the form of a saturable reactor has a high impedance to the high voltage trigger pulse and a low impedance to the current flow from the storage capacitor forming part of the pulse forming network. This invention relates to a laser flash lamp power supply and, more particularly, a triggering circuit for the flash lamp which has low power dissipation.

5 Claims, 3 Drawing Sheets

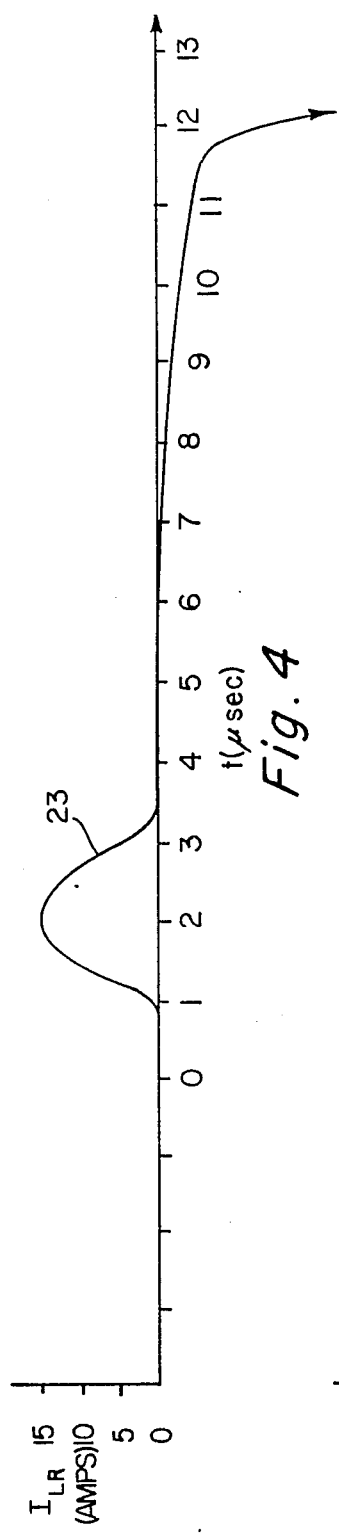
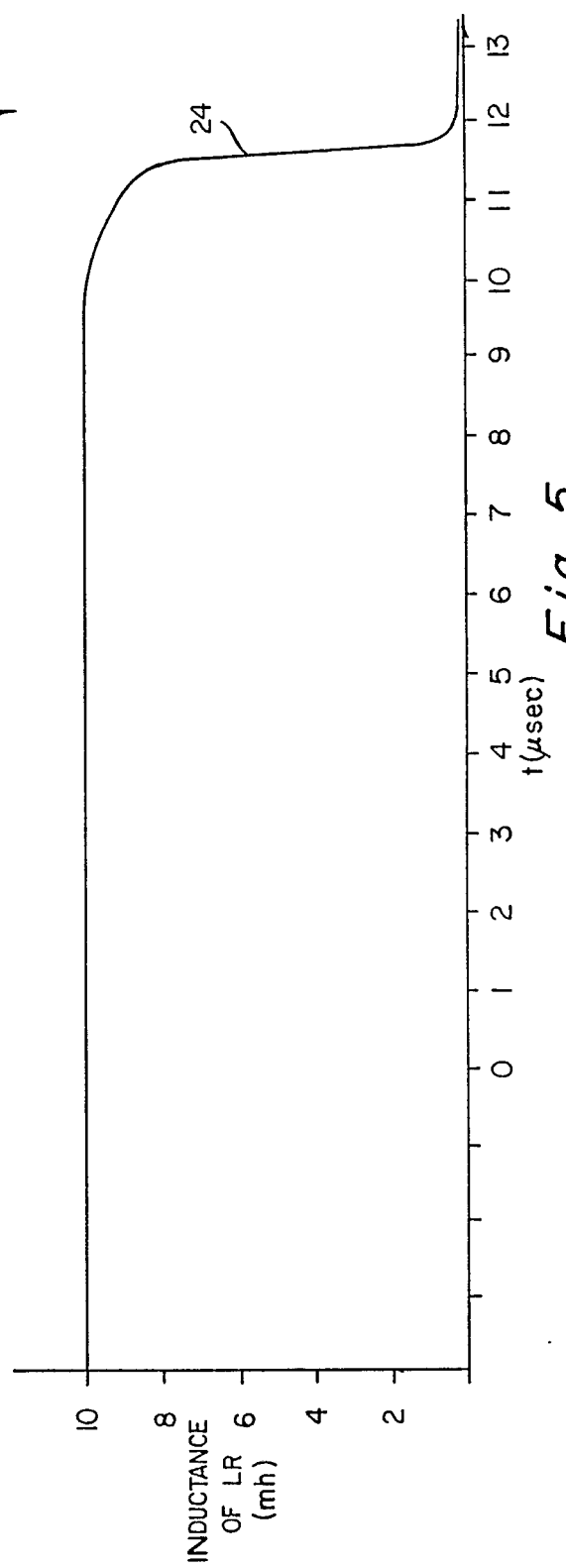
Fig. 4
Fig. 5

4,745,613

LASER FLASH LAMP TRIGGERING CIRCUIT

Presently, at least two circuit designs are known, for triggering laser flash lamps. One of these, known as series triggering, has the secondary winding of a trigger transformer connected in series between the cathode of the flash lamp and one terminal in the lamp power supply. One of the principal disadvantages of such series triggering is due to the fact that the high current discharge from the storage capacitor in the pulse forming network of the power supply passes through the series connected transformer secondary. As a result, substantial energy is lost to $I^2R$ heating of the transformer secondary winding. Because the secondary winding must carry this high current, the transformer windings and associated magnetics must be made as large as possible to reduce these heating losses.

This obviously increases the size and cost of the triggering transformer. Furthermore, because of the power losses in the triggering transformer secondary the input energy to the primary of the transformer must be increased to produce the necessary high voltage pulse to break down the flash lamp gas. In an attempt to avoid the shortcomings of series triggering, an alternate method for triggering the flash lamp has been suggested in which a high voltage pulse is applied to a wire wrapped around the flash lamp so that ionization of the gaseous medium in the lamp is produced by the intense electric field produced when the high voltage triggering pulse is applied to the winding. Parallel triggering is effective in eliminating most of the problems associated with series triggering since the main energy flow from the pulse forming network no longer passes through the winding. However, parallel triggering has disadvantages uniquely associated with this arrangement. Because the flash lamp is usually contained in a reflective metal cavity through which an aqueous cooling solution passes problems can arise because of the possibility of the winding shorting to ground. As a result, the wire must be insulated from the metallic cavity, and the trigger wire winding must be introduced into the cavity through an insulated, water-tight seal which can be troublesome. Furthermore, the aqueous cooling solution must be de-ionized to prevent leakage currents in the solution to the housing and to ground. Thus, parallel triggering of this type is far from an ideal solution and a need still exists to provide adequate triggering for a laser flash lamp without the heating losses and size problems associated with series triggering circuits and the fabricating and operational difficulties associated with a parallel arrangement in which the triggering wire is wrapped directly around the lamp. Applicant has found that a parallel triggering circuit may be utilized which has the advantages of low power consumption and small size of parallel triggering, without the trigger wire being wrapped directly around the lamp.

It is therefore a principal objective of this invention to provide a laser flash lamp triggering circuit which has low power consumption.

It is a further objective of the invention to provide a flash lamp triggering circuit which does not require the use of triggering elements in the flash lamp cavity.

Still another objective of the invention is to provide a flash lamp triggering circuit which minimizes the power input to the triggering circuit.

Other objects and advantages of the invention will become apparent as the description thereof proceeds.

BRIEF SUMMARY OF THE INVENTION

The objectives and advantages of the invention are realized in an arrangement in which the secondary winding of a triggering transformer is connected electrically in parallel with the flash lamp. The parallel triggering circuit path also contains a diode poled to permit the triggering pulse to pass to the flash lamp while blocking current from the pulse forming network from the trigger transformer secondary. In addition, a saturable reactor element is positioned between the triggering transformer and the pulse forming network. This reactance element has a very high impedance to the short duration high voltage triggering pulse (and its high frequency components) while having a low impedance to the main current flow from the pulse forming network. The saturable reactor saturates, causing its inductance and hence its impedance to drop shortly after initiation of the main current flow from the capacitor of the pulse forming network.

The novel features which are characteristic of the invention are set forth with particularity in the appended claims. Invention itself, however, together with further objectives and advantages thereof, may best be understood by reference to the following description taken in connection with the accompanying drawing in which:

BRIEF DESCRIPTION OF THE DRAWING

FIGS. 2 through 5 are graphic illustrations voltage, current and inductance characteristics of the network.

DETAILED DESCRIPTION OF THE INVENTION

Figure 1:
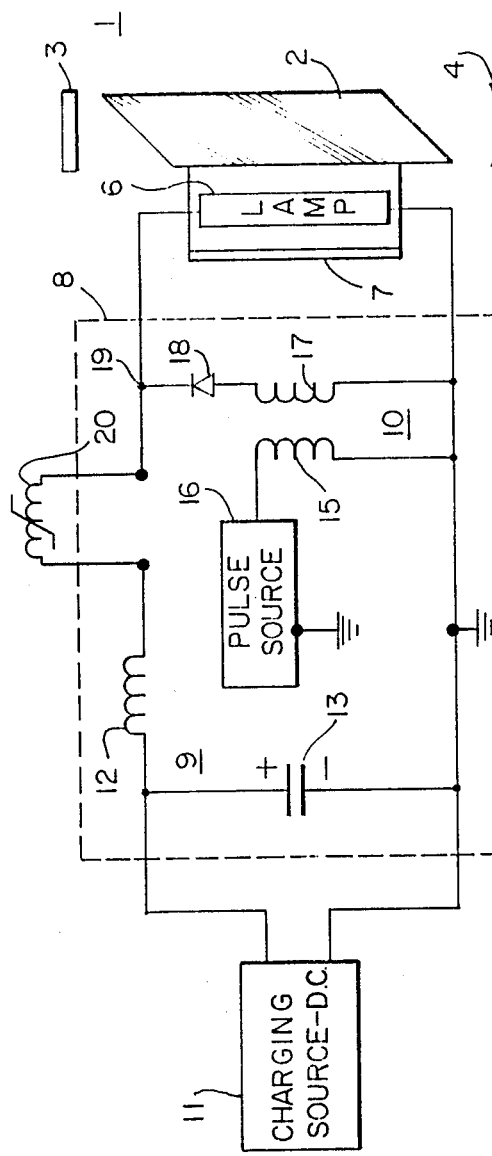
FIG. 1 is a schematic illustration of the power supply and triggering network for a laser flash lamp.

FIG. 1 illustrates a laser 1 consisting of a lasing medium 2 such as a Nd:YAG laser, or the like, which is positioned in optical cavity formed of the mirrors 3 and 4. The laser flash lamp source is positioned adjacent to the lasing material and consists of a xenon flash lamp 6 contained in a flash lamp housing shown generally at 7. As is well known to man skilled in the art, the flash lamp in the housing is cooled by means of a coolant flow, not shown, passing through the housing. Coupled to the laser flash lamp 6 is a flash lamp triggering network 8 which consists of a pulse forming network 9 and a parallel triggering pulse network 10. Parallel triggering pulse network 10 periodically applies (about 10 hertz per second) a short duration (1 to 3 microseconds) high voltage (5 to 15 kilovolt) pulse to the anode of flash lamp 6, ionizing the gas in the flash lamp. After the gas is ionized, current from the pulse forming network flows through the flash lamp causing optical pumping of the lasing material. A DC charging source 11 is connected to the input terminals of pulse forming network 9, which consists of a series energy storing inductance 12 connected in series with the anode of the flash lamp and a main storage capacitor means shown generally at 13, which may consist of one or more storage capacitors connected in parallel. Charging source 11 may consist of a 3-phase AC source and a 3 phase full wave rectifier network to charge the capacitors in the pulse forming network.

The parallel triggering pulse network 10 consists of a transformer having a primary winding 15 connected to a pulse source 16 which periodically applies a triggering pulse to winding 15. The secondary winding 17 of the trigger transformer is connected between the cathode of lamp 6 and a junction node 19 connected to the anode of the flash lamp. Diode 18 is connected in series between winding 17 and node 19. Diode 18 is so poled as to pass the positive high voltage pulses induced in the secondary winding 17, but will block current from pulse forming network 9.

A reactance means 20 preferably in the form of a saturable reactor is connected in between pulse forming network inductance 12 and node 19. Saturable reactor 20 is characterized by the fact that it has a very high inductance and therefore a high inductive reactance to the very short high voltage triggering pulse appearing on secondary winding 17 of the triggering transformer. That is, the triggering pulse, which is approximately 3 microsecond in duration, has very high frequency components so that the high inductive reactance of saturable reactor 20 limits the rate of rise of a current flowing from the very highly positive node 19 to storage capacitor 13 and reduces charging of the capacitor by the high voltage pulse. As a result, the amount of energy required to maintain the voltage at 19 for triggering is minimized. That is, the power that is required from triggering transformer to ionize the lamp is reduced.

In operation, a short 1 to 3 microsecond, 5 to 15 kilovolt pulse is produced on the secondary winding 17 of the trigger transformer network 10, about 10 to 30 times per second. The positive pulse forward biases diode 18 and 5 to 15 kilovolts appear at node 19 and at the anode of flash lamp 6. This high voltage pulse ionizes the gas in the lamp. Shortly thereafter the pulse forming network 9 is discharged through the flash lamp to provide optical pumping of the laser. When the positive pulse appears at node 19, a ramp of current is produced through saturable reactor 20. However, the high inductive reactance of the saturable reactor to the high frequency components of the pulse limit the rate of rise of this current and thus the amount of energy required to keep the voltage at node 19 positive enough to cause ionization of xenon in the flash lamp. When the lamp gas is ionized this essentially grounds junction point 19 and discharge of capacitor 13 through inductance 12 and the saturable reactor 20 and lamp 6 then occurs. Shortly after this main flow of current begins saturable reactor 20 saturates and its inductance and its impedance to the main energy flow is reduced.

Figure 2:
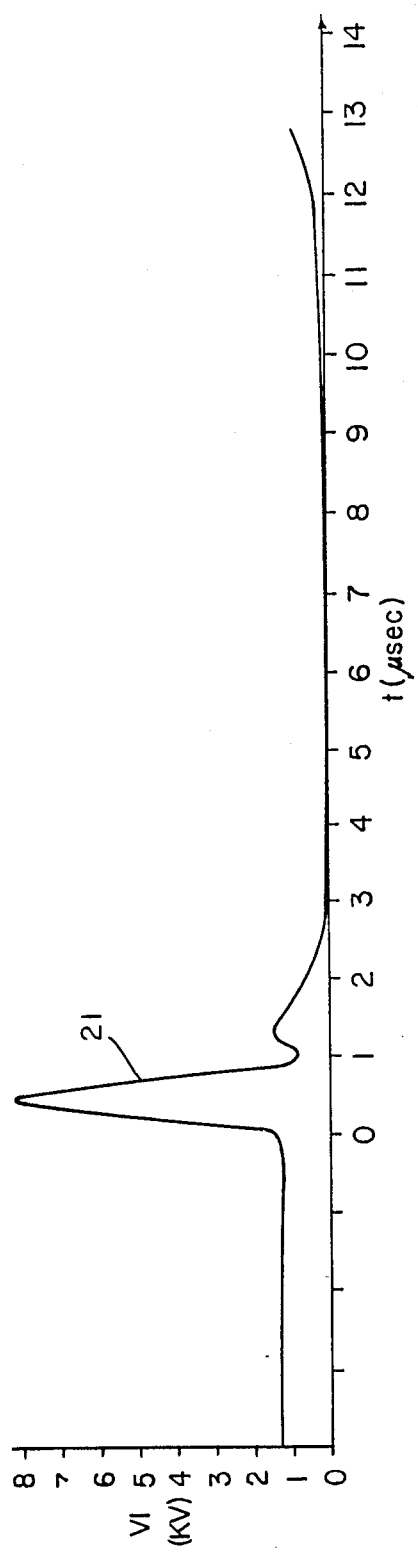
Figure 3:
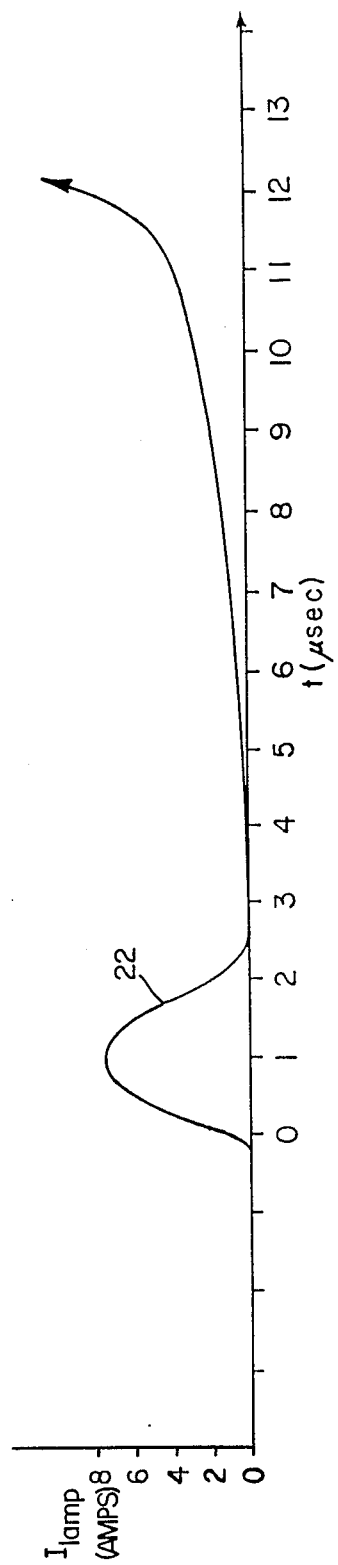

FIGS. 2 to 5 illustrate graphically the operation of the various components of the network, with FIG. 2 illustrating the voltage at node 19; FIG. 3 illustrating the current flow to flash lamp 6; FIG. 4 illustrating the current flow through the saturable reactor and FIG. 5 showing the inductance of the saturable reactor 20 with time as the triggering process. Thus, in FIG. 2 the voltage at junction node 19 is plotted along the ordinate and time in microseconds along the abcissa. Thus, at time (t)=zero when triggering pulse appears across the secondary windering of the triggering transformer and diode 18 is forward biased, the voltage at node 19 illustrated by curve 21 rises to a voltage level of approximately 8 kilovolts. This voltage is sufficient to ionize the gas in the flash lamp, causing the lamp to conduct and within the next several microseconds, the voltage at node 19 drops to ground or zero volts. About 8 microseconds later the main discharge from the capacitor 13 of the pulse forming network begins and the voltage at node 19 begins to rise slowly as the discharge from the capacitor through the flash lamp takes place.

As shown by curve 22 of FIG. 3 at t=0 when the triggering pulse forward biases the diode and brings the voltage at node 19 up to 8 kilovolts or more; a small ramp of current, approximately 8 amps is shown by curve 22 occurs for a period of about 2½ microseconds as the gas in the lamp is ionized and current begins to flow. Shortly thereafter, at about 5 or 6 microseconds after triggering of the flash lamp, the current flowing through the flash lamp begins to increase until 11 microseconds after triggering it begins to increase very steeply as the main discharge from the pulse forming network capacitor 13 through the lamp begins.

FIG. 4 illustrates the current flow through saturable reactor 20. Approximately 1 microsecond after the appearance of the triggering pulse, a short pulse of current 23 begins to flow through the saturable reactor in the direction of the pulse forming network. That is, since the voltage at node 19 is much more positive than the voltage at the pulse forming network capacitor current begins to flow toward the capacitor. However, because of the high inductive impedance of the saturable reactor to the high frequency components of the triggering pulse the magnitude of this current flow is small.

Approximately 8 microseconds later sufficient current from the capacitor flows and the reactor saturates, causing its inductance to drop rapidly and a rapidly increasing current, representing the discharge of the capacitor through the lamp, flows through the reactor. FIG. 5 illustrates the inductance of a saturable reactor during operation. Initially, the inductance of the saturable reactor is approximately 10 millihenries and remains that way for about 10 microseconds until sufficient current has flowed through the reactor to cause it to saturate and hence inductance drops essentially to a very low value in the order of 10 microhenries. Thus, the saturable reactor functions as a variable reactance presenting a high impedance to the very short duration high voltage triggering pulse, and a low impedance to the discharge current from the capacitor of the pulse forming network.

It will be apparent from the foregoing discussion that the laser flash lamp triggering source has been provided which requires less power to produce the high-voltage triggering pulse than would otherwise be required with series triggering. Furthermore, the circuit is so arranged that the high voltage triggering pulse does not significantly charge the storage capacitor in the pulse forming network and thus requires less power to ionize the flash lamp.

While the instant invention has been described in connection with a preferred embodiment thereof, the invention is by no means limited thereto since other modifications of the instrumentality employed may be made and still fall in the scope of the invention and it is the intention of the appending claim to cover all such modifications that fall within the true spirit and scope of the invention.

What is claimed as new and designed to be secured by Letters Patent is:

1. In a laser system including:
   (a) a solid state lasing material mounted in an optical cavity;
   (b) a flash lamp including a pair of electrodes positioned adjacent to said solid state lasing material for optically pumping said solid state lasing material;

(c) a D.C. power supply including energy storage means coupled in series with the flash lamp electrodes to establish a D.C. current flow path between said storage means and said lamp electrodes;

(d) a triggering circuit path connected in parallel with said flash lamp electrodes and connected to said D.C. current path for periodically supplying high voltage triggering pulses to the flash lamp electrodes to initiate ionization of the gas in said lamp and to initiate optical pumping of said lasing material;

(e) saturable reactor means connected in said D.C. current flow path between said point of connection of said triggering circuit to said current flow path and said energy storage means of said power supply, said saturable reactor means having a high impedance to the high voltage triggering pulse to limit current flow from the triggering circuit to the energy storage means in the power supply and having a low impedance to D.C. current flow from the energy storage means to said lamp electrodes once said lamp becomes conductive.

2. The laser system according to claim 1 wherein said triggering circuit includes a undirectional conductive element poled to permit passage of the high voltage triggering pulses while blocking current flow from said power supply through said triggering circuit path.

3. The laser system according to claim 2 wherein said undirectional conductive element is connected in series with the secondary winding of a triggering transformer.

4. The laser system according to claim 3 wherein one end of the parallel triggering path is connected to the junction between one end of said saturable reactor and a lamp electrode.

5. The laser system according to claim 4 wherein said power supply includes a pulse forming network comprising capacitive energy storage mean in parallel with said lamp means and inductive means connected in series between one side of said capacitive storage means and said saturable reactor.

* * * * *